United States Patent [19]
McLaury

[11] Patent Number: 5,659,518
[45] Date of Patent: Aug. 19, 1997

[54] MULTI-PORT MEMORY WITH MULTIPLE FUNCTION ACCESS CYCLES AND TRANSFERS WITH SIMULTANEOUS RANDOM ACCESS

[75] Inventor: Loren L. McLaury, Boise, Id.

[73] Assignee: Micron Technology, Inc., Boise, Id.

[21] Appl. No.: 446,335

[22] Filed: May 22, 1995

[51] Int. Cl.⁶ .................................................. G11C 8/00
[52] U.S. Cl. ................. 365/230.05; 365/233; 365/238.5
[58] Field of Search ............. 365/230.03, 230.05, 365/233, 238.5

[56] References Cited

U.S. PATENT DOCUMENTS

| | | | |
|---|---|---|---|
| 4,667,313 | 5/1987 | Raymond et al. | 365/240 |
| 4,689,741 | 8/1987 | Donald et al. | 364/200 |
| 4,891,794 | 1/1990 | Hush et al. | 365/230.05 X |
| 5,121,360 | 6/1992 | West et al. | 365/230.03 |
| 5,202,587 | 4/1993 | McLaury | 307/296.2 |
| 5,235,545 | 8/1993 | McLaury | 365/189 |
| 5,245,578 | 9/1993 | McLaury | 365/203 |
| 5,265,050 | 11/1993 | McLaury | 365/189 |
| 5,282,177 | 1/1994 | McLaury | 365/230 |
| 5,311,478 | 5/1994 | Paul et al. | 365/230 |
| 5,323,350 | 6/1994 | McLaury | 365/208 |
| 5,325,502 | 6/1994 | McLaury | 395/425 |
| 5,369,622 | 11/1994 | McLaury | 365/233 |
| 5,381,368 | 1/1995 | Donald et al. | 365/189.01 |
| 5,406,527 | 4/1995 | Honma | 365/230.05 |
| 5,450,355 | 9/1995 | Hugh | 365/189.04 |
| 5,452,259 | 9/1995 | McLaury | 365/221 |
| 5,457,654 | 10/1995 | McLaury | 365/189.01 |
| 5,490,112 | 2/1996 | Glen et al. | 365/189.04 |
| 5,506,814 | 4/1996 | Glen et al. | 365/230.03 |

*Primary Examiner*—Joseph A. Popek
*Attorney, Agent, or Firm*—Schwegman, Lundberg, Woessner & Kluth P.A.

[57] ABSTRACT

A memory is described which can successively perform a plurality of functions during one row access cycle. A reallocation circuit and method are provided to "hand off" the multi-port memory strobe operation from the row access strobe input to either the column access strobe input or an optional strobe circuit. By reallocating the strobe operation, combinations of functions can be performed without the need to close the accessed row. The memory can isolate at least two internal memory circuits after preforming a transfer of data therebetween. The memory can thereby randomly access newly transferred data without the need to close the accessed row where the data is located.

17 Claims, 11 Drawing Sheets

MULTI-PORT MEMORY WITH MULTIPLE FUNCTION ACCESS CYCLES AND TRANSFERS WITH SIMULTANEOUS RANDOM ACCESS

TECHNICAL FIELD OF THE INVENTION

The present invention relates generally to multi-port memories and in particular to accessing recently transferred data. Still more particular, the present invention relates to performing multiple functions in a memory while accessing a row of the memory.

BACKGROUND OF THE INVENTION

Figure 1:
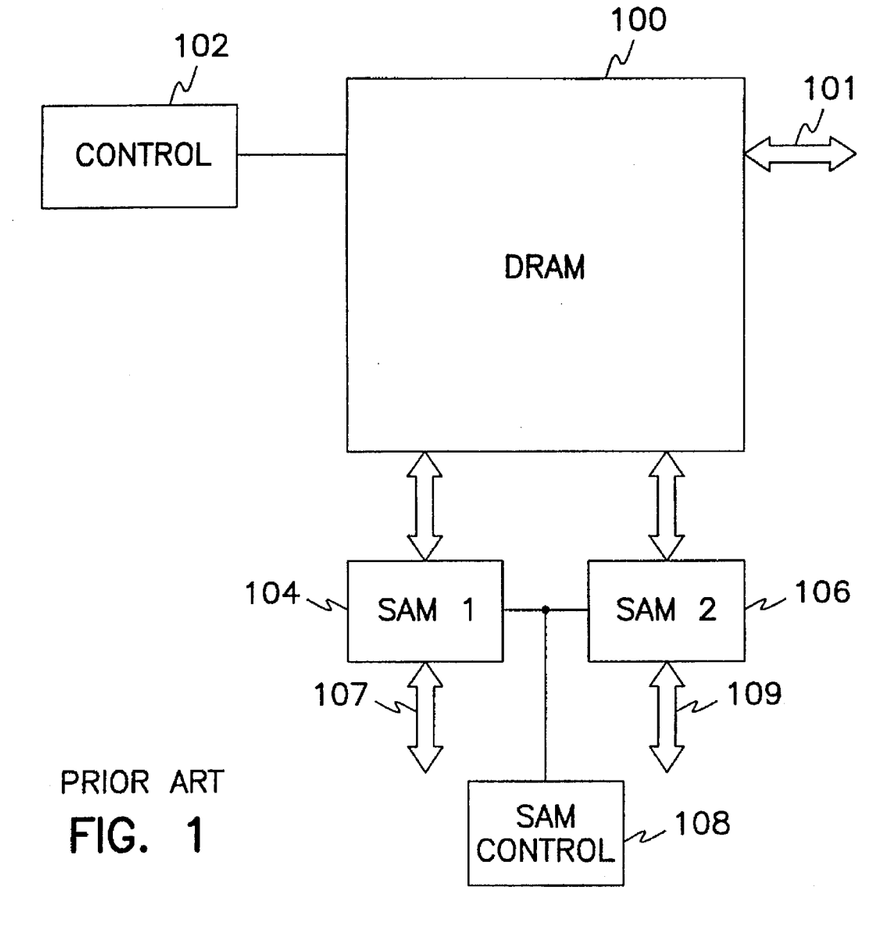
FIG. 1 is a simplified block diagram of a prior art multi-port memory.

FIG. 1 illustrates a simplified block diagram of the basic elements of a prior art multi-port memory similar to the memory described in U.S. Pat. No. 4,891,794 issued to Hush et al. entitled "Three Port Random Access Memory" which is incorporated herein by reference. Multi-port random access memories (RAM) are substantially faster than standard RAM and commonly referred to as video random access memories (VRAM) because of their effectiveness in video systems.

In its simplest form, the multi-port memory includes a dynamic random access memory (DRAM) 100 having input/output lines 101, a DRAM controller 102, two serial access memories (SAM) 104 and 106 and a SAM controller 108. Each SAM is essentially a long shift register which can receive a block of data from the DRAM and serially shift the data out through data port 107 or 109. Each SAM can also serially shift data in through the serial ports and transfer the data to the DRAM. Other multi-port memories may include a different number of serial access memories. For example, a dual port memory incorporates one input SAM and a DRAM.

The DRAM is a dynamic array for storing multiple bit registers in multiple two dimensional planes each having rows and columns. Each bit register is defined by the same row and column addresses in each of the planes. Each SAM has a bit register row associated with one of each of the planes of the DRAM such that the columns of the DRAM correspond to the bits of the register row.

In general, the DRAM and SAM's can operate either independently or in limited combinations for internal transfers of data. When operating in combination, the SAM's are structured to allow each SAM to access one row of the DRAM. Assuming, in a DRAM having 512 column addresses in each row, SAM 104 can read or write to addresses 0–511 of one row of the DRAM and SAM 106 can read or write to addresses 0–511 of one row of the DRAM. This configuration allows for both bi-directional internal transfer of data between the DRAM and the SAM's and independent access to each of the three memories.

Transferring data from a SAM to the DRAM requires the addressing of a given row of the DRAM in which the data is to be transferred. Addressing a row, as known to one skilled in the art, requires pre-charging the row. Once data has been transferred to cells in a row, prior art teaches that the row must be inhibited or closed, see U.S. Pat. No. 4,689,741 to Redwine et at., entitled "Video System having Dual-port Memory with Inhibited Random Access During Transfer Cycles", and U.S. Pat. No. 4,667,313 to Pinkham et at., entitled "Serially Accessed Semiconductor Memory with Tapped Shift Register." If the newly transferred data is to be randomly accessed, the row must therefore be pre-charged and re-addressed. The re-addressing of newly transferred data is time consuming and prevents real time editing of that data.

Further, the row access signal used to access a given row of the DRAM is used to trigger functions other than data transfers. These functions include functions not directly related to a row of memory, for example loading either a mask or color register. To perform these functions, however, a DRAM row must be accessed. The row is then closed upon completion of the function. To speed the operation of the memory, it would be advantageous to access a row of the DRAM, perform a function (related or not related to the accessed row), and then perform a function related to the row without being required to close the row.

For the reasons stated above, and for other reasons stated below which will become apparent to those skilled in the art upon reading and understanding the present specification, there is a need in the art for a memory circuit which can perform multiple functions while a row of the memory is accessed. There is also a need for a multi-port memory which can transfer new data from a SAM to a DRAM and allow real-time random access to this new data.

SUMMARY OF THE INVENTION

The above mentioned problems with multi-port data transfers and other problems are addressed by the present invention and which will be understood by reading and studying the following specification.

A memory is described which can successively perform a plurality of functions during one row access cycle. The memory can isolate at least two internal memory circuits after preforming a transfer of data therebetween. The memory can thereby randomly access newly transferred data without the need to close the accessed row where the data is located.

A memory device is described having a random access memory (RAM) array of randomly addressable memory registers arranged in a plurality of rows and a plurality of columns, and at least one additional memory. The memory device comprises a transfer circuit located electrically between the RAM and the additional memory to regulate the transfer of data therebetween, and isolation circuitry connected to the transfer circuit which electrically isolates the RAM from the additional memory following a transfer of data therebetween, such that page mode may proceed.

Another embodiment of the memory device includes a row access strobe (RAS) input to address one of the plurality of rows and perform a strobe function on additional inputs, control logic to determine a multi-port memory function based upon a state of the additional inputs. The memory further comprises a column access strobe (CAS) input to address at least one of the plurality of columns, and a reallocation circuit which reallocates the strobe function the additional inputs from the RAS input to a strobe signal. One embodiment of the strobe signal comprises the CAS input. An additional embodiment includes a page mode enable circuit to selectively disable page mode functions.

A method is described for performing a plurality of functions in a memory device having a random access memory (RAM) array arranged in a plurality of rows and columns, and at least one additional memory. The method comprises the steps of addressing one row, strobing memory inputs, accessing at least one column, and performing a first function based on a state of the inputs. The method further comprises reallocating a strobe operation to a strobe signal while the one row is addressed, strobing the inputs using the strobe signal, and performing a second function mode based on a state of the inputs.

An alternate method is provided for performing a plurality of functions in a multi-port memory device having a random access memory (RAM) array arranged in a plurality of rows and columns, and at least one additional memory. The method comprises the steps of addressing one row of the plurality of rows using a row access strobe (RAS) input, strobing additional inputs using the RAS input, and disabling page mode functions. At least one column of the plurality of columns is accessed using a column access strobe (CAS) input, and a transfer function is performed to transfer data between the RAM and the at least one additional memory based on a state of the additional inputs. The method further comprises the steps of electrically isolating the RAM from the at least one additional memory, enabling page mode functions, and performing at least one page mode function triggered by CAS.

A method is described for transferring data in a multi-port memory device comprising a random access memory (RAM) and at least one additional memory. The method comprises the steps of electrically connecting the RAM to the at least one additional memory, transferring data between the RAM and the additional memory, and electrically isolating the RAM from the additional memory following the data transfer.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

The present invention provides extended modes of operation in memories which allow for fast access to locations in the memory in which newly transferred data is present. Specifically, multiple functions can be performed while accessing a row of memory without the need to close the row following each function.

Figure 2:
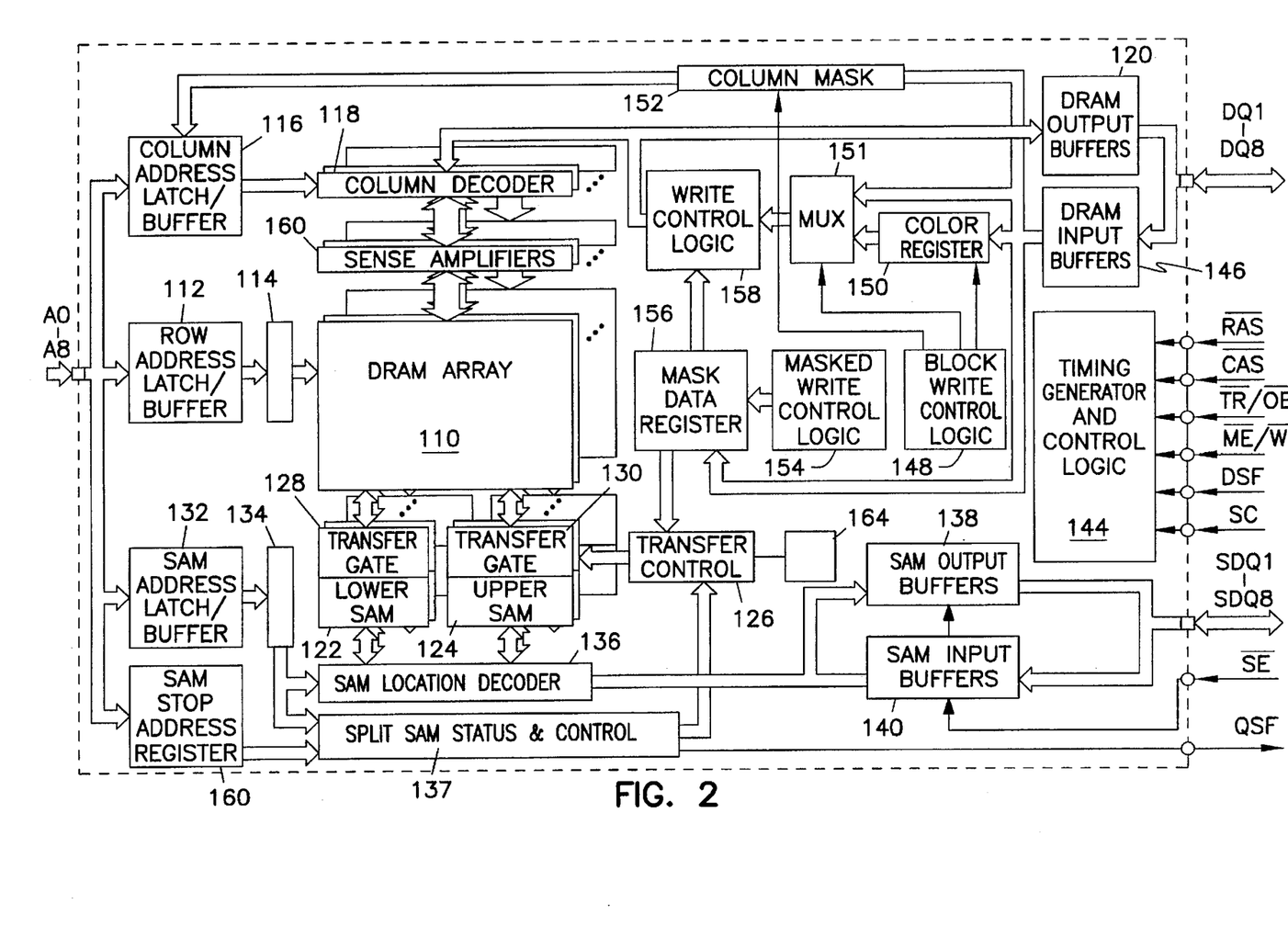
FIG. 2 is a more detailed block diagram of the multi-port memory incorporating the present invention.

FIG. 2 illustrates a block diagram of a multi-port memory incorporating the present invention. The multi-port memory incorporating the present invention is similar to the VRAM available as part number MT42C8256 produced by Micron Technology Inc., Boise, Id., the assignee of the present invention. A complete description of this memory can be found in Micron Semiconductor, Inc. Data Book, page 2–139 to 2–179 (1993).

DRAM 110 is a 512 by 512 by 8 bit array which can be accessed by a microprocessor (not shown) through input/output connections including address lines A0–A8. Row address latch/buffer 112 and row decoder 114 decode a row address from a row address signal provided on A0–A8, and address the corresponding row of the DRAM. Likewise, column address latch/buffer 116 and column decoder 118 decode a column address from a column address signal provided on A0–A8, and address the corresponding column of the DRAM. Data stored in the DRAM 110 can be transferred to outputs DQ1–DQ8 through DRAM output buffers 120.

Two 256×8 bit serial access memories, SAM's 122 and 124, are provided as independent memories and connected to the DRAM for internal transfers of data. SAM 122 is dedicated to internal transfers with DRAM 110 column addresses 0 through 255 and SAM 124 is dedicated to internal transfers with column addresses 256 through 511 of any given row. DRAM 110 and SAM's 122 and 124 can operate as described above either independently or in limited combination for internal data transfers. Transfer control circuit 126 controls the internal transfer of data between the SAM's and the DRAM using transfer gates 128 and 130. The address location of the SAM's are controlled through address lines A0–A8 using SAM address latch/buffer 132, SAM address counter 134 and SAM location decoder 136. SAM serial output is provided on lines SDQ1–SDQ8 through SAM output buffers 138. Likewise, serial input to the SAM's are controlled on lines SDQ1–SDQ8 through SAM input buffer 140. Split SAM status and control 137 provides SAM status feedback to the transfer control 126.

Timing generator and control logic 144 is used to control the many available functions of DRAM 110. DRAM data input is provided on lines DQ1–DQ8 through DRAM input buffers 146. MUX 151 multiplexes the DQ input lines and the color register 150 to write control logic 158. Block write control logic 148, color register 150 and column mask 152 are used to control custom features of the multi-port memory, as described in detail below. Masked write control logic 154, masked data register 156, and write control logic 158 are used to control masking features, as described in detail below. Sense amplifiers 160 are used to detect and amplify data stored in the DRAM.

The present invention is described in a multi-port memory, however, it will be understood that any memory incorporating a random access memory array can be used without departing from the spirit of the present invention.

Input and Output Connections

The input and output connections of the multi-port memory used to communicate with a micro processor are described as follows. Serial clock input (SC) to the timing generator and control logic 144 provides the clock input for the SAM address latch/buffer 132 and SAM address counter 134 for each of the SAM memories. Transfer enable/output enable (TR*/OE*) input provides for the internal transfer of data between the DRAM and the SAM's and also enables the output buffers 120 of the DRAM. The masked enable/ write enable (ME*/WE*) input is used to perform a masked write function. The ME*/WE* can also be used to select a read or write cycle when accessing the DRAM, this includes a read transfer or write transfer with the SAM's. The serial port enable (SE*) input is used to enable the SAM input buffers 140 and output buffers 138. Special function select input (DSF) is used to indicate which special function (block write, flash write, split transfer, etc.) are used for a particular access cycle. Row address strobe (RAS*) input is used to clock in the nine row address bits and strobe for ME*/WE*, TR*/OE*, DSF, SE*, CAS*, and DQ inputs. In standard multi-port memories, the RAS* also acts as the master chip enable and must fall for the initiation of any DRAM or transfer function. Column address strobe (CAS*) input is used to clock in the nine column address bits and as a strobe for the DSF input for a block write function.

Address input lines A0–A8 are used to identify a row and column address to select at least one 8 bit word or register out of the 262, 144 available words, as detailed above. DRAM data input/output lines DQ1–DQ8 provide data input and output for the DRAM and also act as inputs for mask data register 156 and color register 150. Serial data input/output lines SDQ1–SDQ8 provide data input and output to the SAM's 122 and 124. SAM's split status output (QSF) indicates which half of the SAM is being accessed, a low indicates addresses 0–255 are being accessed, while a high indicates addresses 256–511 are being addressed.

Multi-Port Functions

Figure 3:
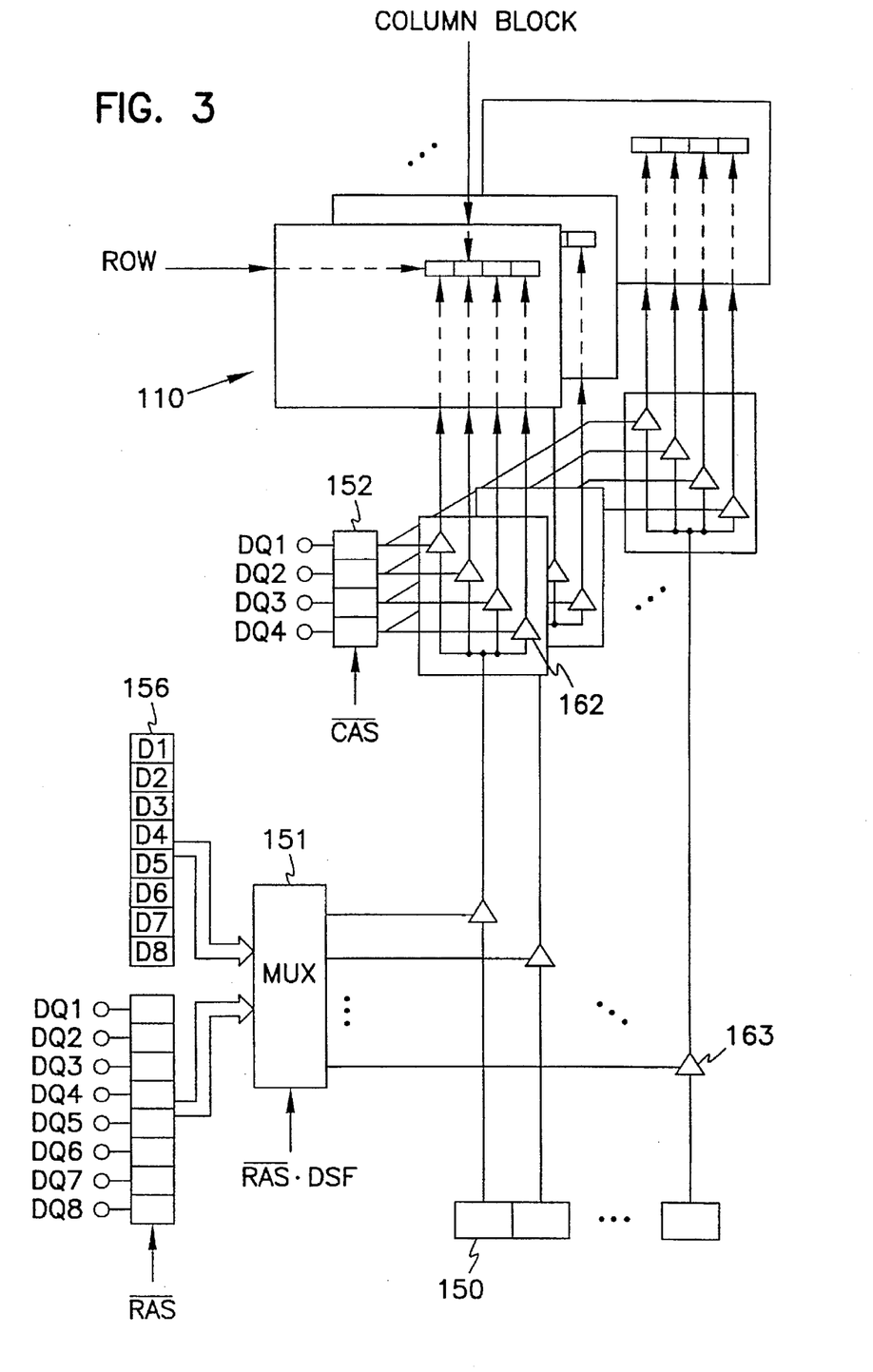
FIG. 3 illustrates a block write function in a DRAM.

There are many modes or functions which can be performed using multi-port memories as seen in FIG. 3. In particular, some functions specific to the present invention are: normal read or write (NR), a block write (BW) to the DRAM, a masked write (RWM) to the DRAM, a masked block write (BWM) to DRAM, a masked flash write (FWM) to DRAM, load mask register (LMR), load color register (LCR), masked write transfer (WT), and a masked split write transfer (SWT). Each of these functions are described in detail below.

Normal random access read or write functions can be performed when a row and column are accessed. An eight bit data word can either be read from the DRAM or written to the DRAM using the DQ lines. Similarly, a page mode function allows the contents of a page, or "row plane", to be accessed so that any word on that page can be read or written without closing the page.

The block write function is used to write the contents of the color register 150 directly to four adjacent column locations of the DRAM 110, see FIG. 3. The color register 150 must be loaded prior to beginning block write functions, see the load color register function described below. The DRAM row is addressed in the same way as a normal DRAM read or write, however, when CAS* goes low A2–A8 specify the block of four adjacent column locations that will be addressed. Column mask 152 and DQ1–DQ4 inputs can then be used to enable any or all of the four columns using enable gates 162 so that the contents of the color register can be written to the column locations which have been enabled. Each DQ location of the color register is written to the four column locations in the corresponding DQ bit plane.

A masked write function eliminates the need to do a read-modify-write function when changing individual bits within an eight bit word. During this function, data present on the DQ1–DQ8 inputs are written into the mask data register 156, on the falling edge of RAS*. The masked data acts as an individual write enable for each of the eight DQ1–DQ8 inputs. That is, if a low (logic 0) is written to a masked data register bit, the input port of that bit is disabled during the subsequent write function and no new data will be written to that DRAM cell location. A high (logic 1) at a masked data register bit enables the input port and allows for a write function to succeed.

The mask write can be combined with the block write function to provide a mask block write function as seen in FIG. 3. The masked block write function is the same as the normal mask write except the mask is now applied to enable a selected number of the eight planes. Mask data register 156 or the DQ lines can be used to enable the enable gates 163 so that color register 150 can be written to the DRAM. By using both the column mask 152 input and the mask write function any combination of the eight bit planes may be masked, along with any combination of the four column locations.

The masked flash write (FWM) function is similar to the masked block function in that it uses the color register to accelerate the writing of a select color to the DRAM memory array. Instead of writing to four adjacent column locations in one DRAM cycle, however, the FWM function writes the contents of the color register to all column locations on an addressed row.

The load mask register (LMR) function loads data present on the DQ input lines into the eight bit masked data register 156. Similarly, the load color register (LCR) function loads data present on the DQ input lines into the color register 150. The contents of the eight bit color register are retained until changed by another load color register function.

Figure 4:
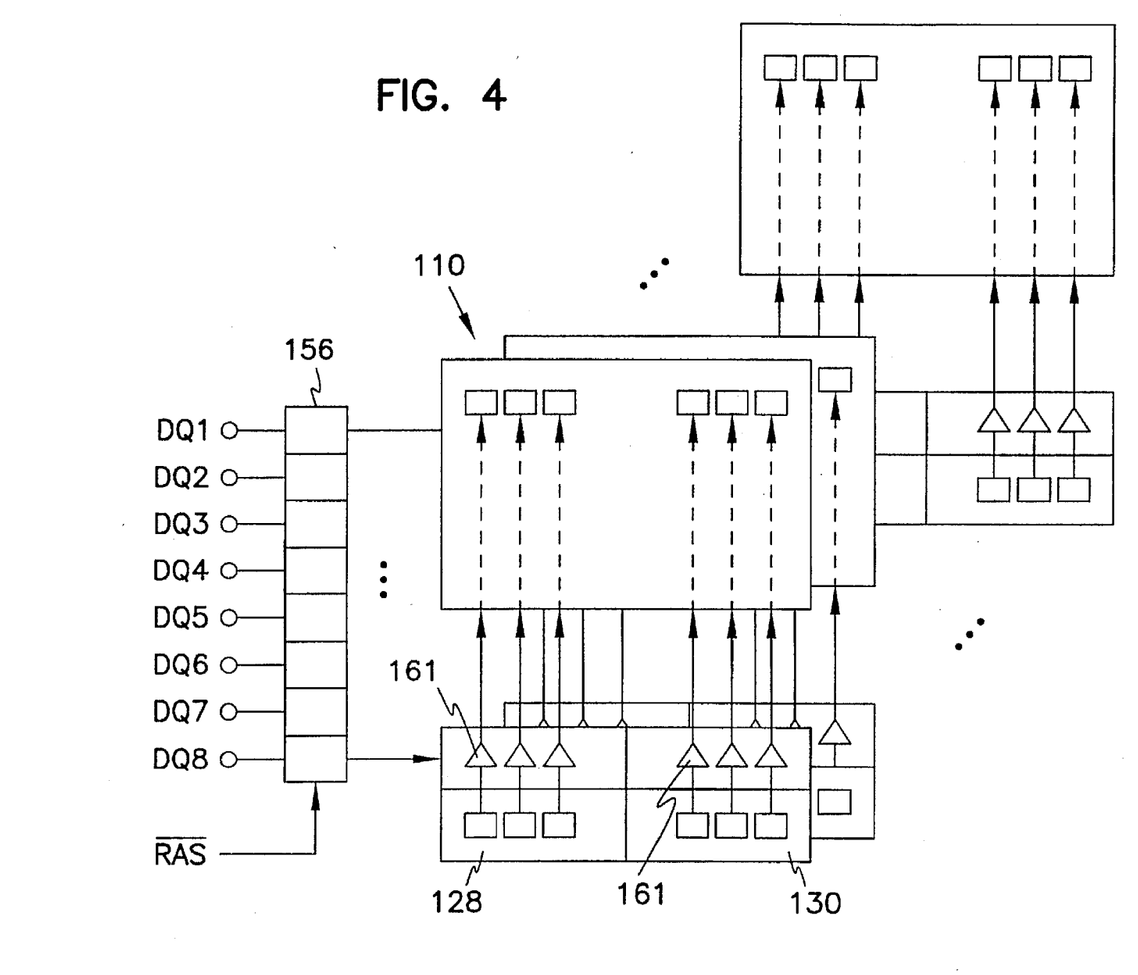
FIG. 4 illustrates a masked write transfer function in a DRAM.

Transfer functions WT and SWT are used to transfer data between the DRAM 110 and the SAM's 122, 124. These transfer functions are initiated when TR*/OE* is low at the falling edge of RAS*. The masked write transfer (WT) function is a SAM to DRAM transfer. A row address is provided on A0–A8 to indicate the DRAM row to which the SAM data registers will be written. A DQ mask must be applied to all WT's as shown in FIG. 4 to enable the SAM's corresponding to each DRAM plane using enable gates 161 of the SAM transfer gates 128 and 130. The mask write transfer therefore allows for SAM to DRAM transfer using the mask register 156.

The mask split write transfer (SWT) function allows serial input data to be transferred to the DRAM from a SAM. The function of the mask split write transfer is very similar to the write transfer described above. The SWT will transfer the idle half of the SAM to the DRAM and set the tap address to where the new serial data will be loaded in that half.

The above detailed functions of a multi-port memory are intended to provide an understanding of some of the available features and is not intended to be exhaustive.

Extended Functions with Simultaneous Access

Referring to Table 1, each of the functions described above are performed during a row access cycle. That is, when RAS* is active, or low. To insure data integrity, prior art requires that upon completion of one of the transfer functions, the accessed row must be closed before the data which was manipulated can be randomly accessed. Thus, the DRAM can not be immediately accessed upon completing a given transfer function. To access a row of data which was manipulated in some manner (read or written), therefore, the row must be closed and a new row access cycle started. One disadvantage of this method is that the row access cycle requires that the row to be accessed be pre-charged. Pre-charging, as known to one skilled in the art, is a time consuming operation. In memories, in particular VRAMs, speed is critical and unnecessary steps must be avoided.

One embodiment of the present invention includes isolation circuitry included with transfer control 126 which isolates the DRAM from the SAM immediately following a transfer there between. The preferred embodiment includes a time trigger circuit 164 connected to transfer control 126. It will be understood that other triggers could be used. These can include logic circuits, unused input lines, or the addition of a new input line.

Additional features of the present invention are a page mode enable circuit which is used to enable page mode functions and a re-allocation circuit included in timing generator and control logic 144 which "hands off" the strobe operation from the RAS* to the CAS* while RAS* is low.

TABLE 1

| CODE | FUNCTION | RAS* FALLING EDGE | | | | CAS* |
|------|----------|-------------------|---|---|---|------|
| | | CAS* | TR*/OE* | ME*/WE* | DSF | FALL DSF |
| FLASH WRITE FUNCTIONS ||||||| 
| FWM | Masked Flash Write to DRAM | 1 | 1 | 0 | 1 | X |
| REGISTER FUNCTIONS |||||||
| LMR | Load Mask Register | 1 | 1 | 1 | 1 | 0 |
| LCR | Load Color Register | 1 | 1 | 1 | 1 | 1 |
| TRANSFER FUNCTIONS |||||||
| WT | Masked Write Transfer | 1 | 0 | 0 | 0 | X |
| SWT | Masked Split Write Transfer | 1 | 0 | 0 | 1 | X |
| PAGE MODE FUNCTIONS |||||||
| RW | Normal DRAM Read or Write | 1 | 1 | 1 | 0 | 0 |
| RWM | Masked Write to DRAM | 1 | 1 | 0 | 0 | 0 |
| BW | Block Write to DRAM | 1 | 1 | 1 | 0 | 1 |
| BWM | Masked Block Write to DRAM | 1 | 1 | 0 | 0 | 1 |

Figure 7:
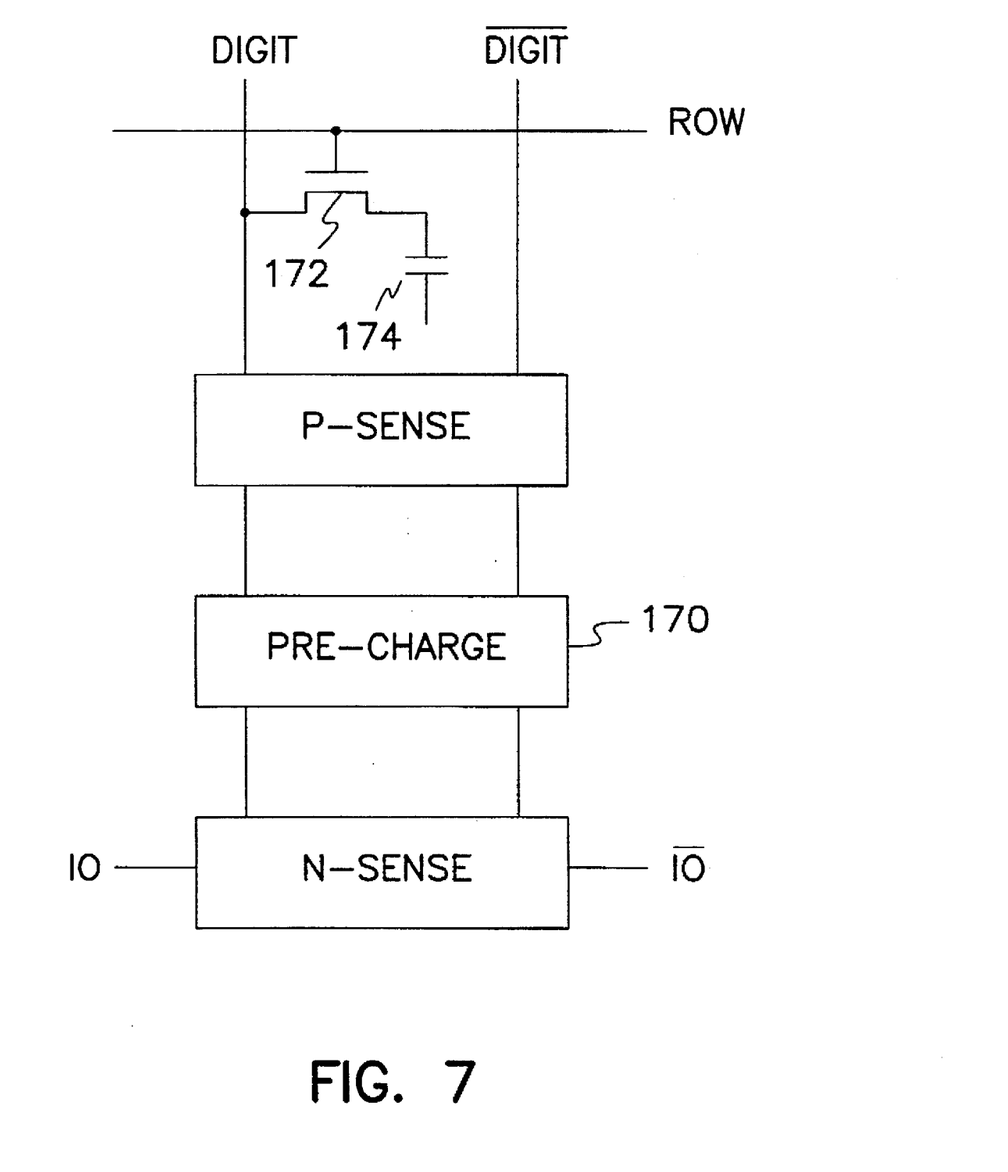
FIG. 7 is a diagram of an array access circuit in a dynamic random access memory.

To understand the hand off operation, reference is made to FIG. 7 which is a simplified illustration of one cell of a memory array and accompanying access circuitry. In a standard multiple function operation, the pre-charge circuit 170 maintains a pre-charge on digit and digit complement (digit*) lines while RAS* is high. When RAS* falls the pre-charge begins to shut off. Also, as detailed above, the function is determined when RAS* falls by timing generator and control logic 144 via TR*/OE*, ME*/WE*, CAS* and DSF. The selected row of the memory, as indicated by the address present when RAS* fell, goes high to activate access transistor 172 and dump the charge stored on memory cell 174 onto the digit line. Both the p-sense and n-sense amps are activated shortly after the memory cell has been accessed. During this activation time the digit lines can be manipulated. That is, the charge stored in the memory cell is relatively small and can be easily overcome prior to the activation of the sense amps. Write transfer and flash write functions are performed during this time period, as described below.

After the memory cell has been accessed, the digit lines are driven to full rail by the sense amps based upon the charge stored on the memory cell. A HANDOFF* signal goes low following a time delay triggered by RAS* falling. The first CAS* falling edge while RAS* is low triggers the desired function as determined by timing generator and control logic 144. If that is the only function desired, both CAS* and RAS* will return high. If the desired function is either a LMR, LCR, WT, or SWT function it can be followed by a page mode function (RW, RWM, BW, BWM) without closing the RAS* cycle, see Table 2. This is accomplished by using a page mode enable circuit 175 similar to that shown in FIG. 8 to disable the page mode functions until the second falling edge of CAS*.

Figure 8:
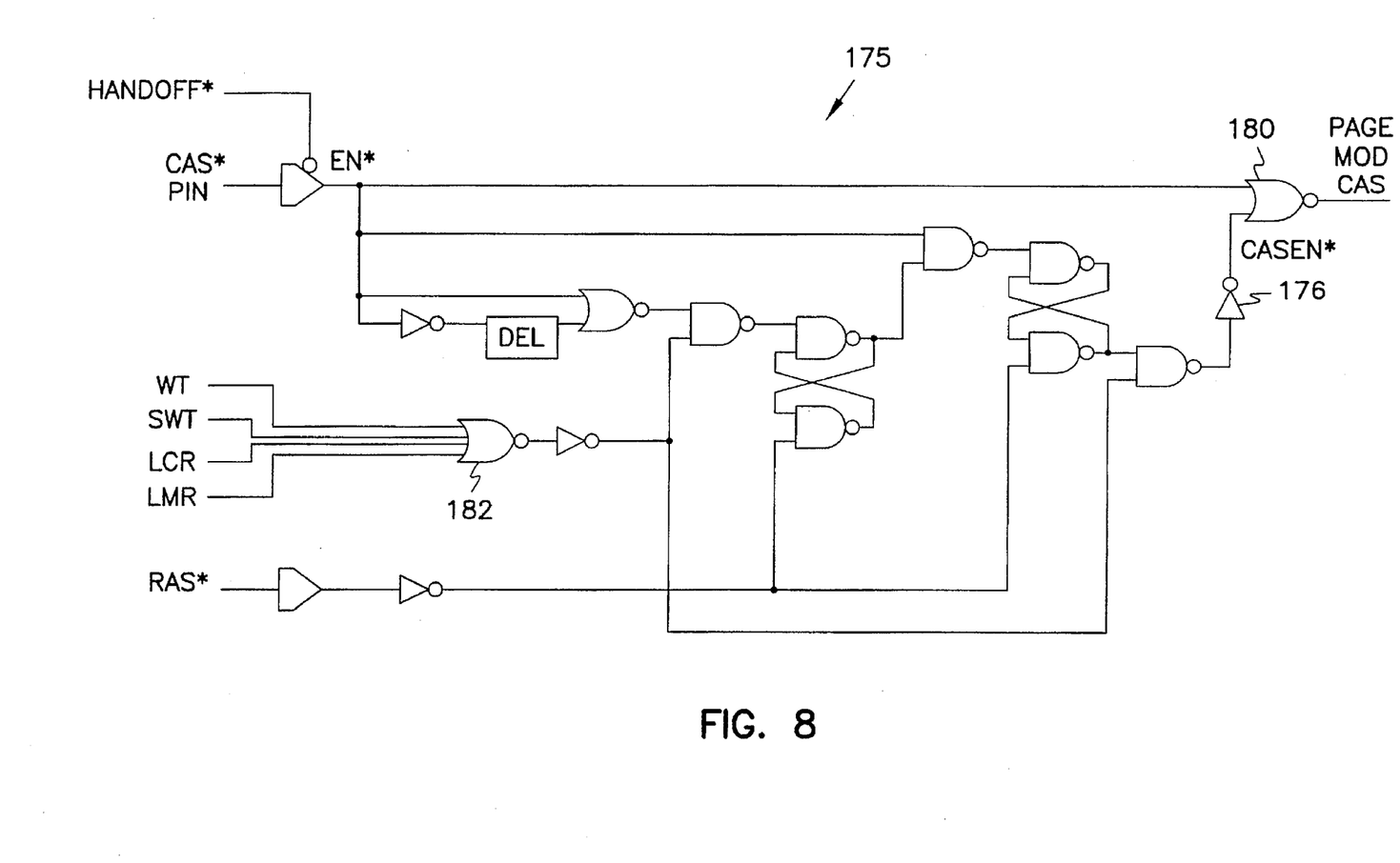
FIG. 8 is a schematic diagram of a page mode enable circuit.
Figure 9:
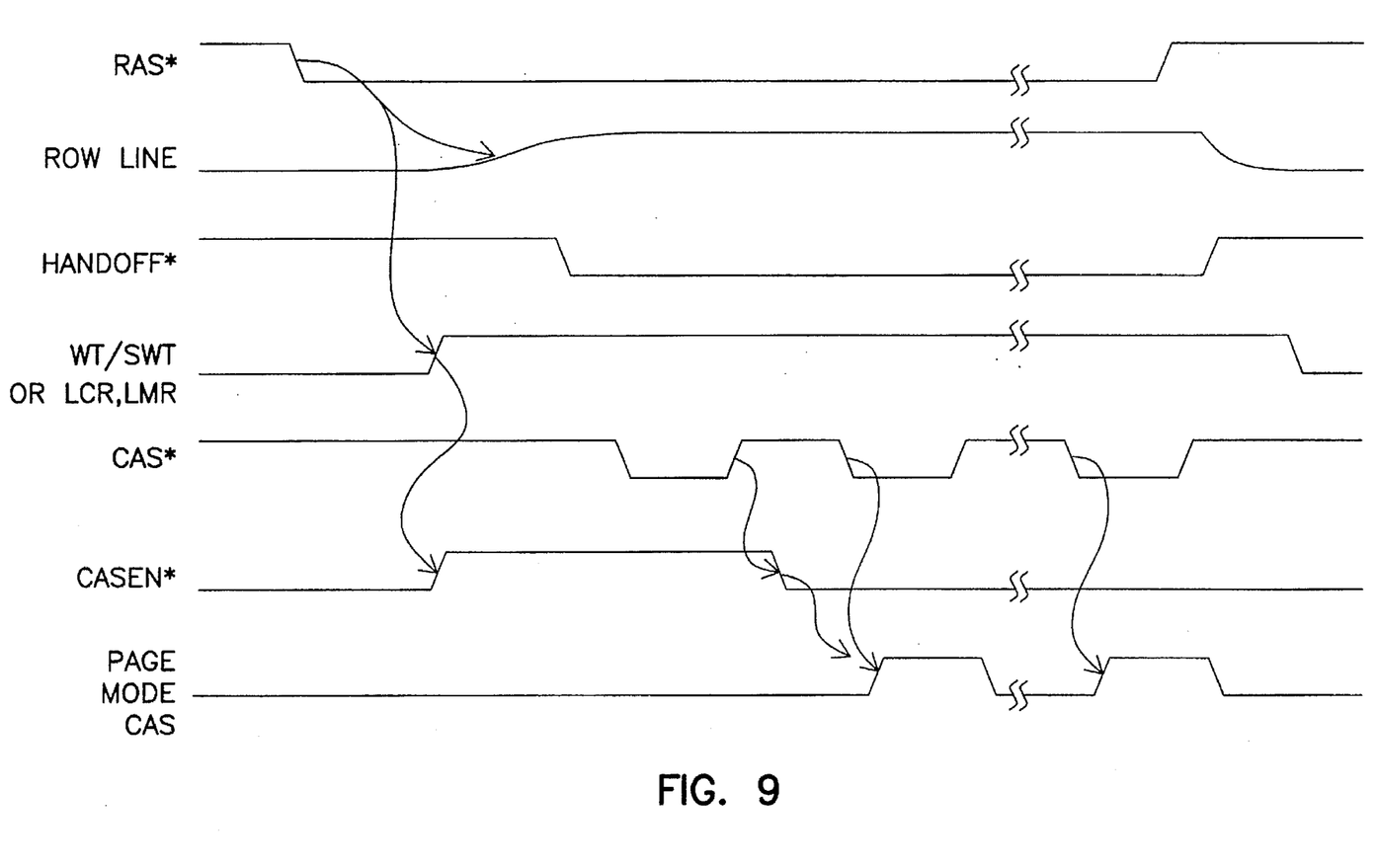
FIG. 9 is a timing diagram of the circuit of FIG. 7.

Referring to FIGS. 8 and 9, the page mode enable circuit 175 is described. CASEN*, the output of inverter 176, is normally low such that the output of NOR 180 follows the inverse of CAS*. When CAS* goes high, however, NOR 180 is latched to a low state.

As seen in FIG. 9, after RAS* has gone low, an input to NOR 182 goes high if either LMR, LCR, WT, or SWT are selected. CASEN* then goes high in response to NOR 182. The row line begins to be activated and the HANDOFF* line goes low following a small delay.

TABLE 2

| | CAS* FALLING EDGE | | |
|------|-----------|---------|-----|
| CODE | FUNCTION | TR*/OE* | ME*/WE* | DSF |
| PAGE MODE FUNCTIONS |||||
| RW | Normal DRAM Read or Write | 1 | 1 | 0 |
| RWM | Masked Write to DRAM | 1 | 0 | 0 |
| BW | Block Write to DRAM | 1 | 1 | 1 |
| BWM | Masked Block Write to DRAM | 1 | 0 | 1 |

On the first CAS* failing edge the output of NOR 180 (Page Mode CAS) remains low. The first rising edge of CAS, * resets CASEN* to a low state. The Page Mode CAS, therefore, follows the inverse of CAS* on successive CAS* cycles. RAS* returns high when the desired page mode functions are completed.

To fully utilize the multiple function operation, the first function should be completed as fast as possible. This function is preferably performed in one of three ways. The first is for performing write transfer functions, either a WT or a SWT. For these functions the SAMs are coupled to the digit lines via the transfer gates 128 or 130 after the pre-charge circuits turn off and before the sense amps strobed. After the sense amps are strobed, the SAMs are decoupled using trigger circuit 164. The first falling edge of CAS* can be used to trap a tap address for the serial counter for outputting data from the SAMs. Page mode functions can ensue on successive CAS* cycles, see Table 2.

Flash write functions are performed in a different manner than the write transfer functions. The SAMs are not coupled to the digit lines during a FWM function. Instead, the color register is coupled to the p-sense amps after the pre-charge circuits turn off and before the sense amps strobed. U.S. Pat. No. 5,305,263 to Morgan describes a technique for coupling the color register through the p-sense amps, and is entirely incorporated herein by reference. As with the WT and SWT functions, the transfer is complete prior to HANDOFF* going low. Because the CASEN* remains low during flash write functions, it is possible for page mode functions to begin on the first CAS* falling edge following a FWM function.

For LCR and LMR functions, the respective registers are loaded on the first failing edge of CAS*, as detailed above. Page mode functions can then follow on successive CAS* cycles.

Mask Write followed by Page Mode Read/Write

Figure 5:
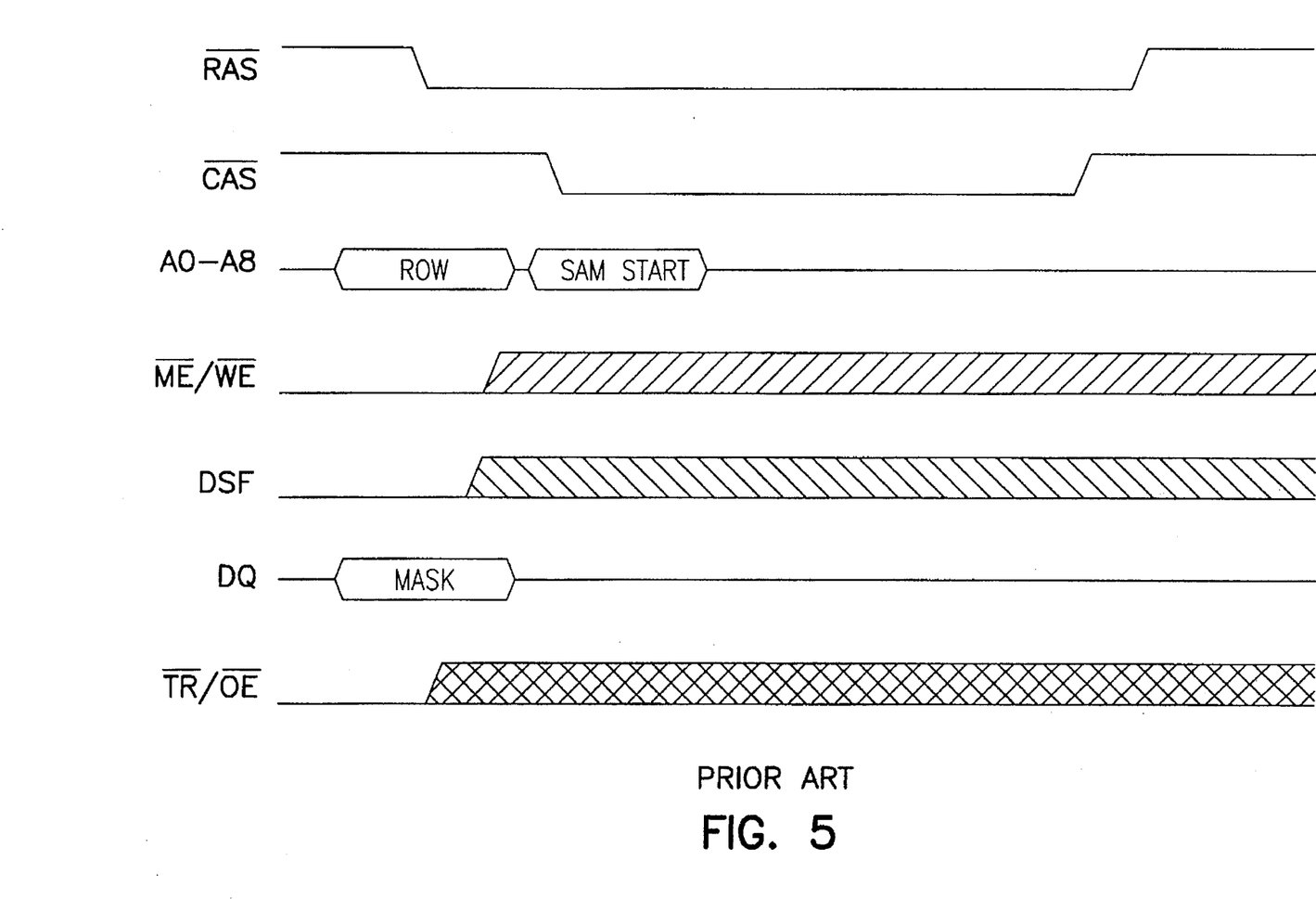
FIG. 5 is a timing diagram of a prior art masked write transfer.
Figure 6:
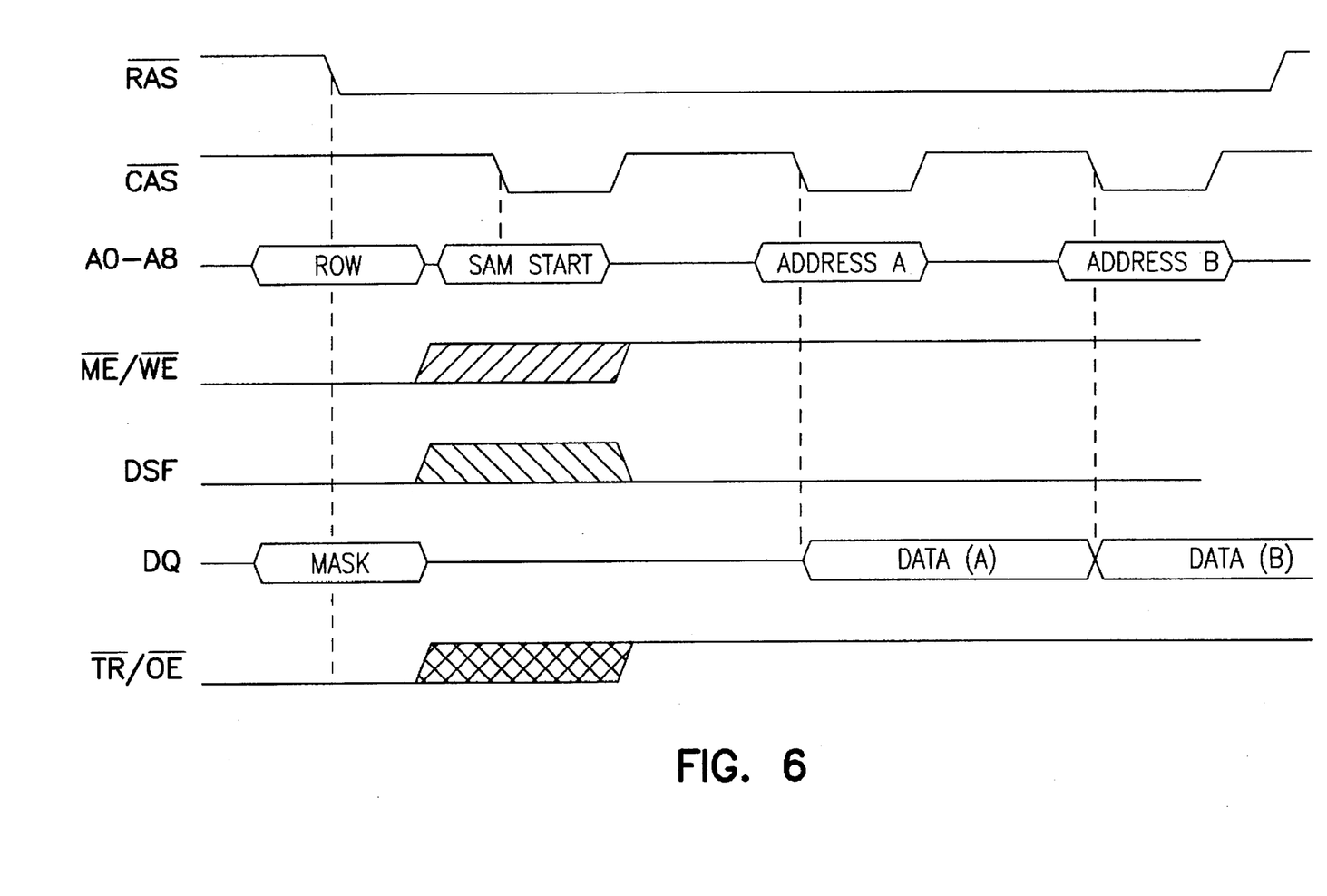
FIG. 6 is a timing diagram of a masked write transfer followed by a page mode read.

To better illustrate this feature of the invention, reference is made to FIGS. 5 and 6 illustrating a prior art masked write transfer and a masked write transfer followed by a RW function of the present invention, respectively. The masked write transfer of FIG. 5 is initiated when RAS* goes low and ME*/WE* is low, DSF is low, TR*/OE* is low, and CAS* is high, see Table 1. RAS* going low signals to the DRAM the presence of a valid row address at A0 to A8. RAS* also inputs a bit plane mask from the DQ inputs to the mask register 156 to be applied to transfer gates 128 and 130 as describe above. When CAS* goes low, data is transferred from the SAM to the DRAM. RAS* returns to a high state upon the completion of the transfer. If the newly transferred data is to be randomly accessed, RAS* must return low and a new function performed.

FIG. 6 illustrates a masked write transfer immediately followed by a page mode read function on some of the same data without closing the row. The masked write transfer function, as described above, is initiated when RAS* goes low and ME*/WE* is low, DSF is low, TR*/OE* is low, and CAS* is high. Page mode enable circuit 175 disables page mode functions. RAS* going low signals to the VRAM the presence of a valid row address at A0 to A8 and loads the mask register 156. Data is transferred from the SAM to the DRAM. Upon completion of the transfer, the transfer gate between the SAM and the DRAM is disabled by trigger circuit 175 as detailed above. The first CAS* cycle is used to load a new tap address. The rising edge of CAS* enables page mode and the strobe function is then handed off to CAS* such that when CAS* goes low the inputs are strobed to determine what function is to be performed. Upon the second falling edge of CAS*, DSF is low, TR*/OE* is high, and ME*/WE* is high. The status of the inputs indicate a page mode read/write function (RW), see Table 2. The falling CAS* also notifies the DRAM of the presence of a valid column address (A) at address lined A0–A8. Data (A) present at column address (A) is connected to the DQ lines. When CAS* goes high, the data remains available on the DQ lines until the next low transition of CAS*. This low transition can be used to read/write data B from another address from address (B) as illustrated. It can be seen that by toggling CAS* different addresses can randomly be accessed on a page indicated by the accessed row.

The mask write transfer function followed by a page mode read/write function illustrates one multiple function using the present invention, however, it will be understood by one skilled in the art that any transfer function between a SAM and the DRAM can be immediately followed by any random access function. Further, this invention is not limited to transfer functions. Any register, transfer, or flash write function of Table 1 can be performed during a RAS* cycle and be immediately followed by any of the page mode functions using CAS* cycles.

Flash Write followed by Page Mode Read/Write

Figure 10:
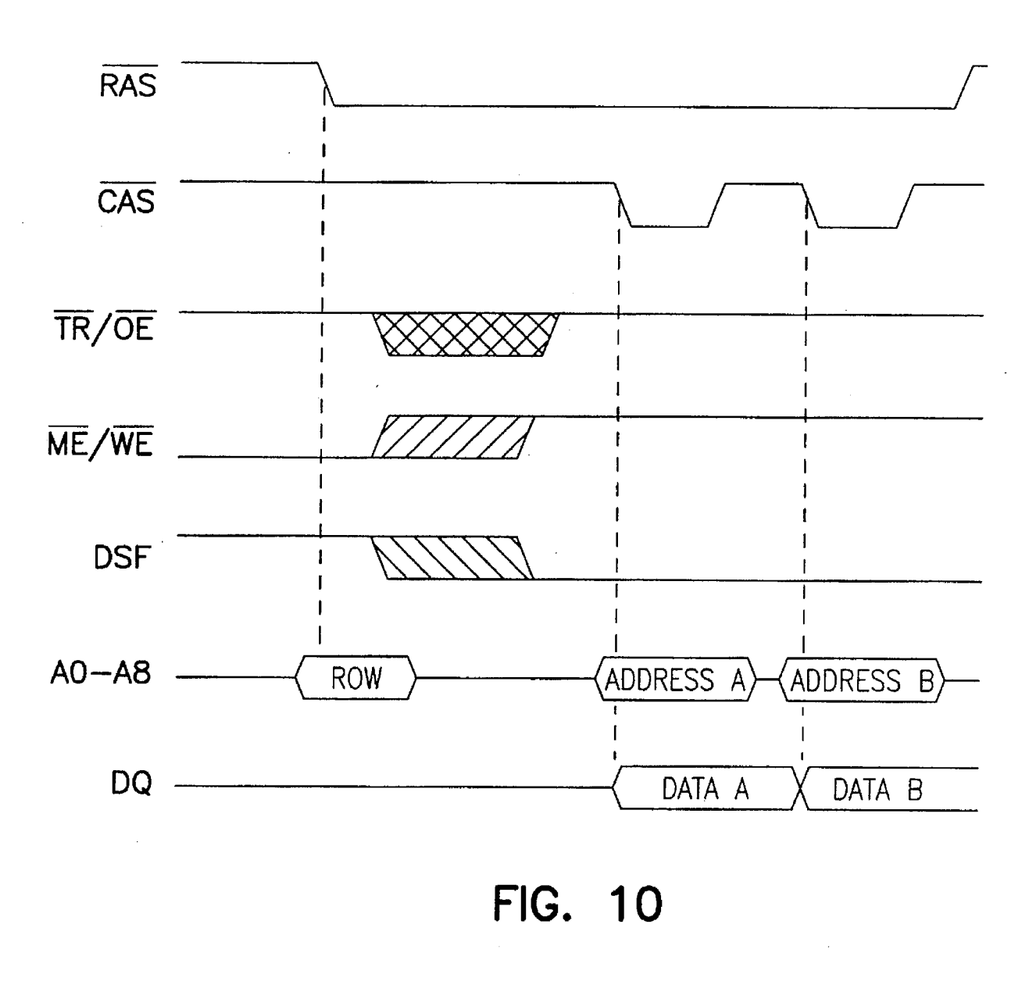
FIG. 10 is a timing diagram of a flash write function followed by a page mode function.

FIG. 10 illustrates the timing of a flash write followed by a page mode read/write function. As detailed above, when RAS* falls, the inputs indicate a flash write function from Table 1. The color register is connected to the p-sense amps such that an entire row, identified on address lines, is written to a state stored in the color register. Cas* cycles occurring during the RAS* cycle can then be used to perform page mode functions of Table 2, such as the page mode read/write.

Load Color Register followed by Page Mode Read/Write

Figure 11:
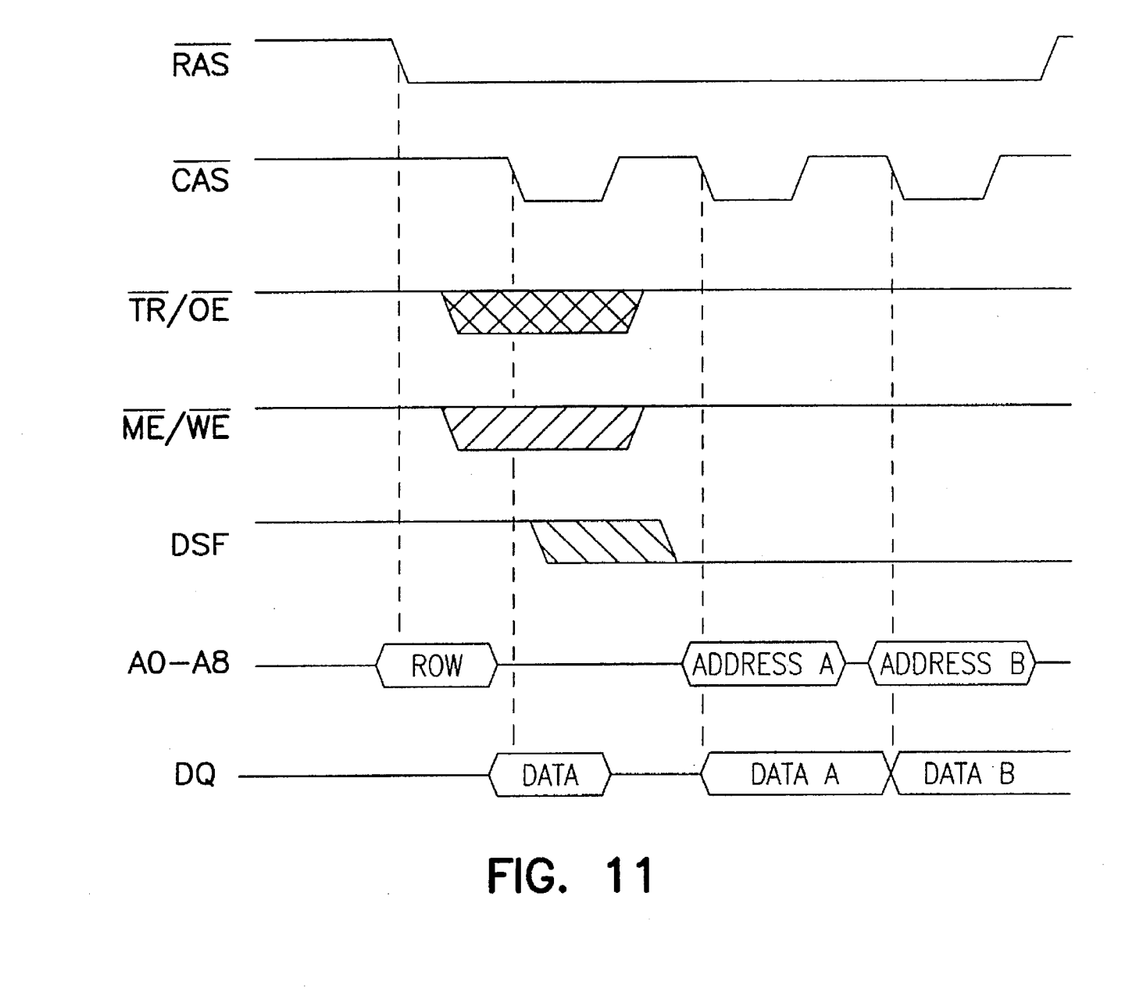
FIG. 11 is a load color register function followed by a page mode function.

FIG. 11 illustrates the timing of a load color register function followed by a page mode read/write function. When RAS* falls, the inputs define a LCR function and disables the page mode functions. The first CAS* cycle loads the color register with data from the DQ lines. When CAS* goes high, the page modes are enabled and successive CAS* cycles can be used to perform page mode functions, such as page mode read/write.

The LCR function followed by a page mode read/write function illustrates one multiple function using the present invention, however, it will be understood by one skilled in the art that any register function can be immediately followed by any page mode functions of Table 2.

Conclusion

The present invention provides an multi-port memory which can isolate at least two internal memory circuits after preforming a transfer of data therebetween. The multi-port memory can thereby randomly access newly transferred data without the need to close the accessed row where the data is located. To randomly access the new data, a reallocation circuit and method are provided to "hand off" the multi-port memory strobe function from the RAS* to either the CAS* line or an optional strobe circuit. By reallocating the strobe function, additional combinations of functions can be performed without the need to close the accessed row.

What is claimed is:

1. A memory device having a random access memory (RAM) and at least one serial memory, the memory device comprising:

a transfer circuit located electrically between the RAM and the at least one serial memory to regulate the transfer of data therebetween;

isolation circuitry connected to the transfer circuit which electrically isolates the RAM from the at least one serial memory substantially immediately following a transfer of data therebetween;

a row access strobe (RAS) input used to indicate that an address signal is available to address one of a plurality of rows of the RAM, and used to initiate a signal state strobe function of additional inputs;

control logic to determine a memory function based upon a state of the additional inputs;

a column access strobe (CAS) input used to indicate that an address signal is available to address at least one of a plurality of columns of the RAM; and a reallocation circuit which reallocates the signal state strobe function of the additional inputs from being initiated by the RAS input to a strobe signal after accessing one of the plurality of rows of the RAM.

2. The memory device of claim 1, further including a trigger circuit connected to the isolation circuitry which provides a signal to trigger the isolation circuitry.

3. The memory device of claim 2, where the trigger circuit comprises a timing circuit.

4. The memory device of claim 4 where the strobe signal is the CAS input.

5. The memory device of claim 1 further comprising a page mode enable circuit coupled to the control logic which selectively disables page mode functions.

6. A multi-port memory device having a random access memory (RAM) and at least one serial memory, the multi-port memory device comprising:

a row access strobe (RAS) input used to indicate that an address signal is available to address one of a plurality of rows of the RAM, and used to initiate a signal state strobe function of additional inputs;

control logic to determine a multi-port memory function based upon a state of the additional inputs;

a column access strobe (CAS) input used to indicate that an address signal is available to address at least one of a plurality of columns of the RAM; and a reallocation circuit which reallocates the signal state strobe function of the additional inputs from being initiated by the RAS input to a strobe signal after accessing one of the plurality of rows of the RAM.

7. The multi-port memory device of claim 6, further including;

a transfer circuit located electrically between the RAM and the at least one serial memory to regulate the transfer of data therebetween; and isolation circuitry connected to the transfer circuit which electrically isolates the RAM from the at least one serial memory substantially immediately following a transfer of data therebetween.

8. The multi-port memory device of claim 7, further including a trigger circuit connected to the isolation circuitry which provides a signal to trigger the isolation circuitry.

9. The multi-port memory device of claim 8, where the trigger circuit comprises a timing circuit.

10. The multi-port memory device of claim 6 where the strobe signal is the CAS input.

11. The multi-port memory device of claim 6 further comprising a page mode enable circuit coupled to the control logic which selectively disables page mode functions.

12. A method of performing a plurality of functions in a memory device having a random access memory (RAM) array arranged in a plurality of rows and columns, and at least one additional memory, the method comprising the steps of:

addressing one row of the plurality of rows using a row access strobe (RAS) input to latch a row address signal provided on address inputs;

checking an electrical state of additional inputs in response to the RAS input;

accessing at least one column of the plurality of columns using a column access strobe (CAS) input to latch a column address signal provided on address inputs;

performing a first function based on a state of the additional inputs;

after the first function is performed, reallocating a strobe function for checking an electrical state of the additional inputs from being responsive to the RAS input to being responsive to a strobe signal while the one row is addressed;

checking an electrical state of the additional inputs in response to the strobe signal; and performing a second function mode based on a state of the additional inputs.

13. The method of performing a plurality of functions in a memory device of claim 12, where the first function is a transfer function to transfer data to the RAM from the at least one additional memory, and the second function is a page mode function.

14. The method of performing a plurality of functions in a memory device of claim 12, where the first function is a register function and the second function is page mode function.

15. The method of performing a plurality of functions in a memory device of claim 12, where the first function is a flash write function and the second function is a page mode function.

16. A method of performing a plurality of functions in a multi-port memory device having a random access memory (RAM) array arranged in a plurality of rows and columns, and at least one additional memory, the method comprising the steps of:

addressing one row of the plurality of rows using a row access strobe (RAS) input to latch a row address signal provided on address inputs;

checking an electrical state of additional inputs in response to the RAS input;

disabling page mode functions;

accessing at least one column of the plurality of columns using a column access strobe (CAS) input to latch a column address signal provided on address inputs;

performing a transfer function to transfer data between the RAM and the at least one additional memory based on a state of the additional inputs while the page mode functions are disabled;

electrically isolating the RAM from the at least one additional memory after the transfer function is complete;

enabling page mode functions; and performing at least one page mode function initiated by a transition of a signal provided on the CAS input.

17. A method of transferring data in a multi-port memory device comprising a random access memory (RAM) and at least one additional memory, the method comprising the steps of;

addressing one row of the RAM;

electrically connecting the RAM to the at least one additional memory;

transferring data between the RAM and the at least one additional memory;

electrically isolating the RAM from the at least one additional memory substantially immediately following the data transfer; and performing a page mode function on the RAM while the one row of the RAM remains addressed and after the step of electrically isolating the RAM.

* * * * *